United States Patent
Murai et al.

(10) Patent No.: US 9,326,370 B2
(45) Date of Patent: Apr. 26, 2016

(54) PRINTED CIRCUIT BOARD

(71) Applicant: CANON KABUSHIKI KAISHA, Tokyo (JP)

(72) Inventors: Yusuke Murai, Kawasaki (JP); Sou Hoshi, Miura (JP); Nobuaki Yamashita, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 8 days.

(21) Appl. No.: 13/852,630

(22) Filed: Mar. 28, 2013

(65) Prior Publication Data
US 2013/0265726 A1 Oct. 10, 2013

(30) Foreign Application Priority Data
Apr. 9, 2012 (JP) ................. 2012-088554

(51) Int. Cl.
*H01L 23/48* (2006.01)
*H05K 1/02* (2006.01)
*H05K 1/18* (2006.01)

(52) U.S. Cl.
CPC .............. *H05K 1/025* (2013.01); *H05K 1/0225* (2013.01); *H05K 1/181* (2013.01); *H05K 1/0243* (2013.01); *H05K 2201/093* (2013.01); *H05K 2201/09263* (2013.01); *H05K 2201/09709* (2013.01)

(58) Field of Classification Search
CPC ......... H01L 23/48; H01L 21/60; H01L 25/07; H01L 25/18
USPC .......... 361/760, 792–795, 780; 174/260–262, 174/254–257, 265, 267
See application file for complete search history.

(56) References Cited

U.S. PATENT DOCUMENTS

| 6,002,593 A | 12/1999 | Tohya et al. |
| 6,075,211 A * | 6/2000 | Tohya et al. ................. 174/255 |
| 6,515,868 B1 | 2/2003 | Sasaki et al. |

(Continued)

FOREIGN PATENT DOCUMENTS

| CN | 1154645 A | 7/1997 |
| CN | 1201363 A | 12/1998 |

(Continued)

OTHER PUBLICATIONS

U.S. Appl. No. 13/916,443, filed on Jun. 12, 2013.

(Continued)

*Primary Examiner* — Jenny L Wagner
*Assistant Examiner* — Michael P McFadden
(74) *Attorney, Agent, or Firm* — Fitzpatrick, Cella, Harper & Scinto

(57) ABSTRACT

Provided is a printed circuit board capable of increasing an inductance value of a power pattern and a ground pattern while keeping a low electric resistance value of the power pattern and the ground pattern. The printed circuit board includes a printed wiring board including: a power layer having a power pattern formed therein; and a ground layer having a ground pattern formed therein. On the printed wiring board, an LSI as a semiconductor device and an LSI as a power supply member are mounted. The ground pattern has a first ground region that overlaps the power pattern as viewed from the direction perpendicular to the surface of the printed wiring board. In the first ground region, at least one defect portion is formed. In the first ground region, the defect portion forms a region that is narrower than the power pattern.

11 Claims, 10 Drawing Sheets

(56) References Cited

U.S. PATENT DOCUMENTS

| | | | |
|---|---|---|---|
| 8,380,080 B2 | 2/2013 | Kawaguchi et al. | |
| 2008/0115964 A1 | 5/2008 | Chang et al. | |
| 2009/0206951 A1* | 8/2009 | Nakamura et al. | 333/181 |
| 2012/0111623 A1* | 5/2012 | Chen | H05K 1/0216 174/260 |
| 2013/0170167 A1 | 7/2013 | Miyazaki et al. | |

FOREIGN PATENT DOCUMENTS

| | | |
|---|---|---|
| CN | 101188902 A | 5/2008 |
| CN | 101672959 A | 3/2010 |
| JP | 2001-119110 A | 4/2001 |
| JP | 2012-069815 A | 4/2012 |
| WO | 2012/039120 A | 3/2012 |

OTHER PUBLICATIONS

European Search Report dated Jun. 2, 2014 for counterpart European Patent Appln. 13162441.3.

Chinese Office Action dated Jul. 13, 2015 for counterpart Chinese Patent Application No. 201310120012.3.

* cited by examiner

FIG. 7A
FIG. 7B
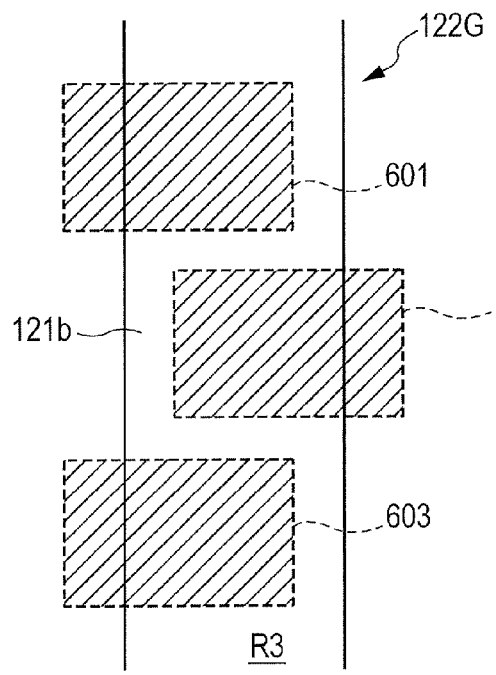
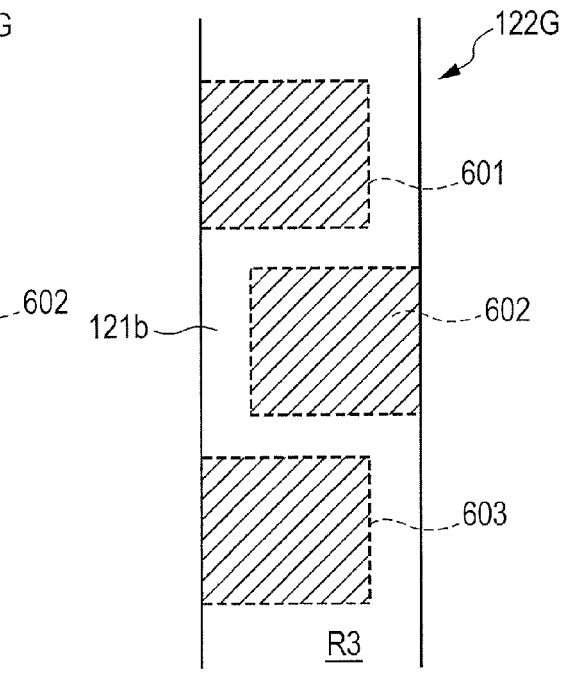

PRINTED CIRCUIT BOARD

BACKGROUND OF THE INVENTION

1. Field of the Invention

The present invention relates to a printed circuit board having a semiconductor device mounted on a printed wiring board.

2. Description of the Related Art

In recent years, along with an increase in consumption current of a large-scale integration (hereinafter referred to as "LSI") as a semiconductor device, a malfunction of the LSI caused by fluctuations in power potential and ground potential has been a problem.

Operation of an LSI generates a potential fluctuation (power noise) that is determined by the product of a current flowing through a power terminal and a ground terminal and an impedance of the LSI as seen from the power terminal and the ground terminal. When the potential fluctuation propagates through a power pattern and a ground pattern of the printed wiring board, a power potential and a ground potential for operating another LSI may fluctuate to cause a malfunction of the LSI.

One conceivable method for suppressing the propagation of the fluctuations in power potential and ground potential caused by the operation of the LSI is decoupling, which electrically separates the power terminal of the LSI from the power pattern of the printed wiring board in a high frequency region. Therefore, an inductance element is conventionally interposed between the power terminal of the LSI and the power pattern of the printed wiring board. However, the number of components increases because the inductance element is interposed.

To deal with this problem, it has been proposed to decouple LSIs by forming an elongated meander power pattern in the printed wiring board so as to increase an inductance value of the power pattern (see Japanese Patent Application Laid-Open No. 2001-119110).

However, although the inductance value of the power pattern can be increased as the power pattern becomes thinner, an electric resistance value of the power pattern is also increased at the same time. The increased electric resistance value of the power pattern results in a large power voltage drop that is determined by the product of a DC current supplied to the LSI (average consumption current) and the electric resistance value of the power pattern. Thus, a DC power voltage for driving the LSI may become insufficient.

SUMMARY OF THE INVENTION

It is therefore an object of the present invention to provide a printed circuit board capable of increasing an inductance value of a power pattern and a ground pattern with respect to a high frequency region while keeping a low electric resistance value thereof with respect to a DC current.

According to an exemplary embodiment of the present invention, there is provided a printed circuit board, including: a printed wiring board including: a power layer having a power pattern formed therein; and a ground layer having a ground pattern formed therein, the ground layer being opposed to the power layer across a dielectric layer; a semiconductor device mounted on the printed wiring board, the semiconductor device having a power terminal connected to the power pattern and a ground terminal connected to the ground pattern; and a power supply member mounted on the printed wiring board, the power supply member supplying DC power to the semiconductor device via the power pattern and the ground pattern. The ground pattern includes at least one defect portion formed therein in a first ground region, the first ground region overlapping the power pattern as viewed from a direction perpendicular to a surface of the printed wiring board. In the first ground region, the at least one defect portion forms a region that is narrower than the power pattern.

This configuration may increase the inductance value of the power pattern and the ground pattern with respect to a high frequency region while keeping a low electric resistance value thereof with respect to a DC current.

Further features of the present invention will become apparent from the following description of exemplary embodiments with reference to the attached drawings.

BRIEF DESCRIPTION OF THE DRAWINGS

FIG. 7A is a conceptual diagram illustrating a modified example of a defect portion of the printed circuit board according to the second embodiment of the present invention.

FIG. 7B is a conceptual diagram illustrating another modified example of the defect portion of the printed circuit board according to the second embodiment of the present invention.

DESCRIPTION OF THE EMBODIMENTS

Embodiments of the present invention are described in detail below with reference to the accompanying drawings.

First Embodiment

Figure 1A:
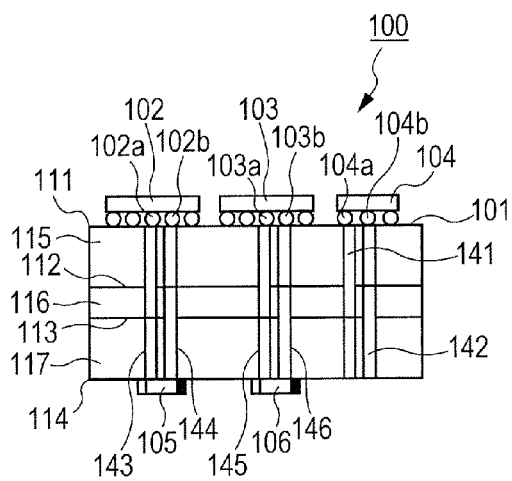
FIG. 1A is a schematic diagram illustrating a schematic configuration of a printed circuit board according to a first embodiment of the present invention.
Figure 1B:
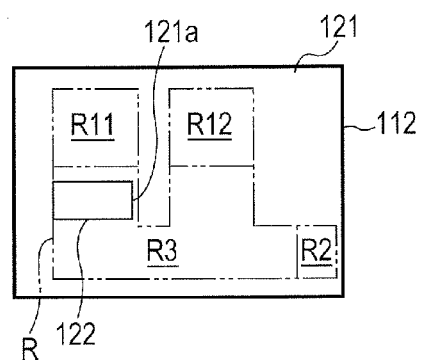
FIG. 1B is a schematic diagram illustrating a schematic configuration of the printed circuit board according to the first embodiment of the present invention.
Figure 1C:
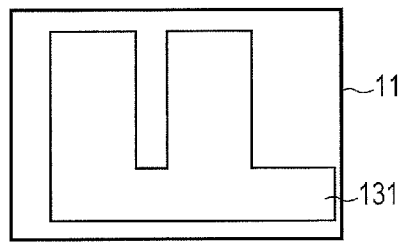
FIG. 1C is a schematic diagram illustrating a schematic configuration of the printed circuit board according to the first embodiment of the present invention.
Figure 1D:
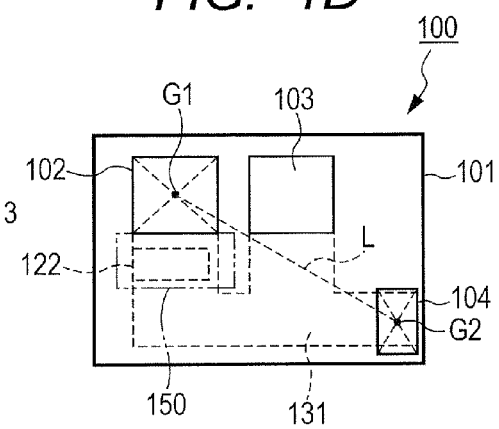
FIG. 1D is a schematic diagram illustrating a schematic configuration of the printed circuit board according to the first embodiment of the present invention.

FIGS. 1A to 1D are explanatory diagrams illustrating a schematic configuration of a printed circuit board according to a first embodiment of the present invention. FIG. 1A is a cross-sectional view of the printed circuit board. FIG. 1B is a plan view of a ground layer of a printed wiring board. FIG. 1C is a plan view of a power layer of the printed wiring board. FIG. 1D is a plan view of the printed circuit board.

A printed circuit board 100 includes a printed wiring board 101, an LSI 102 that is a semiconductor device (first semiconductor device) mounted on the printed wiring board 101, and an LSI 104 that is a power supply member mounted on the printed wiring board 101. In the first embodiment, the printed circuit board 100 further includes an LSI 103 mounted on the printed wiring board 101, which is another semiconductor device (second semiconductor device) than an LSI. The printed circuit board 100 further includes a decoupling capacitor 105 connected between a power terminal 102a and a ground terminal 102b of the LSI 102. The printed circuit board 100 further includes a decoupling capacitor 106 connected between a power terminal 103a and a ground terminal 103b of the LSI 103.

The printed wiring board 101 is a multilayered printed wiring board that includes a signal wiring layer 111 as one surface layer, a ground layer 112 as an inner layer, a power layer 113 as an inner layer, a signal wiring layer 114 as the other surface layer, and dielectric layers 115 to 117 provided between the respective layers. The power layer 113 and the ground layer 112 are opposed across the dielectric layer 116.

The ground layer as used in the present invention is a wiring layer having a ground conductor formed thereon, and is a conductive layer that has a relatively larger area of the ground-potential conductor than those of the other conductive layers. Therefore, in addition to the ground-potential wiring and the ground-potential conductive plane, the ground layer may be provided with a power-potential wiring, a power-potential conductive plane, other signal wirings, and the like. The number of the ground layers is not limited to one, and multiple ground layers may be provided.

The power layer as used in the present invention is a wiring layer having a power conductor formed thereon, and is a conductive layer that has a relatively larger area of the power-potential conductor than those of the other conductive layers. Therefore, in addition to the power-potential wiring and the power-potential conductive plane, the power layer may be provided with a ground-potential wiring, a ground-potential conductive plane, other signal wirings, and the like. The number of the power layers is not limited to one, and multiple power layers may be provided.

The signal wiring layer as used in the present invention is a conductive layer other than the above-mentioned ground conductive layer and power conductive layer. In some typical multilayered printed circuit boards, a front surface layer (first surface layer) and a rear surface layer (second surface layer) are signal wiring layers. Alternatively, the signal wiring layer may be provided as an inner layer. Still alternatively, the signal wiring layer may be provided with a power-potential or ground-potential wiring or conductive plane in addition to wirings for signal transmission.

The LSIs 102, 103, and 104 are mounted on the one surface layer (surface) of the printed wiring board 101. The capacitors 105 and 106 are mounted on the other surface layer (surface) of the printed wiring board 101.

Signal wirings (not shown) are formed in the signal wiring layers 111 and 114. A power pattern 131 that is a power supply wiring is formed in the power layer 113. A ground pattern 121 that is a ground wiring is formed in the ground layer 112. The power pattern 131 and the ground pattern 121 are formed of flat conductors.

The LSI 104, which is a power supply member, is a power circuit that converts a DC voltage supplied from an external power supply into a DC voltage suitable for the LSIs 102 and 103 and supplies DC electric power to the LSIs 102 and 103. The LSI 104 has a power terminal 104a electrically connected to the power pattern 131 through a power via 141, and a ground terminal 104b electrically connected to the ground pattern 121 through a ground via 142. The LSI 102 has the power terminal 102a electrically connected to the power pattern 131 through a power via 143, and the ground terminal 102b electrically connected to the ground pattern 121 through a ground via 144. The LSI 103 has the power terminal 103a electrically connected to the power pattern 131 through a power via 145, and the ground terminal 103b electrically connected to the ground pattern 121 through a ground via 146.

The capacitor 105 has one terminal connected to the power via 143 and the other terminal connected to the ground via 144. The capacitor 106 has one terminal connected to the power via 145 and the other terminal connected to the ground via 146.

The LSI 102 and the LSI 103 operate with the same voltage. The LSI 104 supplies DC electric power (DC voltage and DC current) to the LSI 102 and the LSI 103 through the power pattern 131 and the ground pattern 121. The LSI 102 and the LSI 103 operate with power fed from the common LSI 104.

In the first embodiment, the ground pattern 121 is a solid pattern formed into a plane shape as illustrated in FIG. 1B. As illustrated in FIG. 1C, the power pattern 131 is formed so as to extend from the LSI 104 to the LSI 102 and the LSI 103, and the power wiring is shared by the LSI 102 and the LSI 103.

On the printed wiring board 101, there are mounted a semiconductor device (not shown), a power supply member (not shown), and other components that operate with a different voltage from that of the LSIs 102 and 103. A power pattern (not shown) that electrically connects power terminals of those components together is formed in the power layer 113. Ground terminals of the semiconductor device (not shown), the power supply member (not shown), and other components are connected in common to the ground pattern 121.

In this case, a DC power-potential current flows through the power pattern 131 from the LSI 104 to the LSI 102. The power pattern 131 cannot be formed as a solid pattern like the ground pattern 121 because another power pattern needs to be formed in the power layer 113. It is, however, preferred to form the power pattern 131 as wide as possible in order to reduce the electric resistance value. On the other hand, a DC ground current flows through the ground pattern 121 from the LSI 102 to the LSI 104. The ground pattern 121 is a solid pattern, and hence the electric resistance value is lower than that of the power pattern 131, and the ground current flows along the shortest path.

When the LSI 102 is fed to operate, a voltage fluctuation (power noise) is generated. The power noise generated by the LSI 102 is returned to the LSI 102 through the capacitor 105. As the frequency of power noise becomes higher, however, a larger inductive component is included in an element of the capacitor 105 as a parasitic component and becomes nonnegligible.

By the way, when the power noise generated by the LSI 102 propagates through the power pattern 131, a return current is generated in the ground pattern 121 in a direction opposite to the propagating direction of the noise current of the power pattern 131. The path of the return current is not the shortest path of the DC current, but a path along the noise current flowing through the power pattern 131. Therefore, by defining the path of the return current, the noise current flows through the same path in the power pattern 131.

In view of the above, according to the first embodiment, a defect portion 122 where a pattern is missing is formed in the ground pattern 121 in a path along the power pattern 131. Now, the configuration of the ground pattern 121 is specifically described below. FIGS. 1B to 1D are diagrams as viewed from the direction (normal direction) perpendicular to the surface of the printed wiring board 101.

In the ground pattern 121, as illustrated in FIG. 1B, there is a first ground region R that overlaps the power pattern 131 as viewed from the direction perpendicular to the surface of the printed wiring board 101. The first ground region R is a region defined by projecting the power pattern 131 illustrated in FIG. 1C onto the ground layer 112 as viewed from the direction perpendicular to the surface of the printed wiring board 101.

In the first ground region R, a region that overlaps the LSI 102 and a region that overlaps the LSI 103 as viewed from the direction perpendicular to the surface of the printed wiring board 101 are referred to as "first region R11" and "first region R12", respectively. Further, in the first ground region R, a region that overlaps the LSI 104 as viewed from the direction perpendicular to the surface of the printed wiring board 101 is referred to as "second region R2". A region determined by subtracting the first regions R11 and R12 and the second region R2 from the first ground region R is referred to as "third region R3".

In the first embodiment, the defect portion 122 is formed in the third region R3 of the ground pattern 121 while leaving a region 121a (region narrower than the power pattern) that communicates the first region R11 and the second region R2. In other words, the defect portion 122 is formed so as not to divide the third region R3 into multiple parts. Therefore, when the third region R3 of the ground pattern 121 in which the defect portion 122 is formed is projected onto the power pattern 131, the LSI 104 serving as the power supply member and the LSI 102 to be supplied with power are not separated in a high frequency region. The width of the region 121a (width in the direction orthogonal to the flowing direction of the noise current) is set to be smaller than the width of the power pattern 131 (width in the direction orthogonal to the extending direction of the power pattern 131). Note that, if the third region R3 is divided, the path of the noise current flowing through the power pattern and the path of the return current flowing through the ground pattern are separated from each other, leading to an increase in radiation amount of electromagnetic waves.

As illustrated in FIG. 1B, the solid ground pattern 121 is present on the entire region of the ground layer 112 excluding the defect portion 122. The defect portion 122 in the first embodiment is a single rectangular ground defect. The defect portion 122 is formed to be in contact with one boundary of the third region R3 in its width direction and be spaced apart from the other boundary. In this way, the single region 121a, which is narrower than the power pattern 131, is formed to extend linearly in the third region R3. In FIG. 1B, the defect portion 122 is illustrated by an oblong as a rectangle, but is not limited to an oblong or a rectangle.

According to the first embodiment described above, in the ground pattern 121, the return current of power noise passes through the region 121a that is narrower (thinner) than the power pattern 131. Correspondingly to the return current, the current of power noise flows through the power pattern 131 concentratedly on a portion opposed to the region 121a. In this way, the inductance values of the power pattern 131 and the ground pattern 121 can be increased against power noise, and hence the decoupling effect of a high frequency current can be obtained.

It is unnecessary to narrow the power pattern 131, such as provide a defect in the power pattern 131, in order to increase the inductance value of the power pattern 131. Thus, in the power pattern 131, the rise in electric resistance value against a DC current can be suppressed. Also the return path of the DC power potential current caused by the operation of the LSI 102 is not blocked by the defect portion 122, and hence the rise in electric resistance value of the ground pattern 121 can be suppressed.

As described above, it is possible both to increase the inductance values for high frequency decoupling and to reduce the electric resistance values of the power pattern 131 and the ground pattern 121 against a DC current. In addition, the power noise generated by the LSI 102 can be prevented from propagating to the LSI 103 to which a power voltage having the same potential is supplied. The power noise generated by the LSI 102 can also be prevented from propagating to another device through the LSI 104 serving as the power supply member.

Now, a description is given of a region 150 in which the defect portion 122 is formed. A potential fluctuation generated in the LSI 102 propagates through the power pattern 131 and the ground pattern 121, which is responsible for a malfunction of the LSI 103. Setting the inductance of the power pattern 131 in the vicinity of the LSI 102 to be high is effective for suppressing the propagation of the potential fluctuation. In order to function the characteristics of wirings using the defect portion 122 as inductance as a filter, the inductance needs to be a lumped constant in a frequency band equal to or lower than the upper limit of the potential fluctuation.

In a ⅛ wavelength region, the wiring structure of the printed wiring board 101 can be treated as a lumped constant circuit. When the upper frequency of the potential fluctuation is represented by "f", a distance at which the inductance can be treated as a lumped constant in the upper frequency band or lower can be approximately calculated by Expression 1 based on the light speed C, the specific dielectric constant ∈r of the dielectric material, and the upper frequency f in consideration of wavelength shortening.

$$(C/(f \times \sqrt{\in r}))/8 \qquad \text{Ex. 1}$$

Example 1

Figure 2:
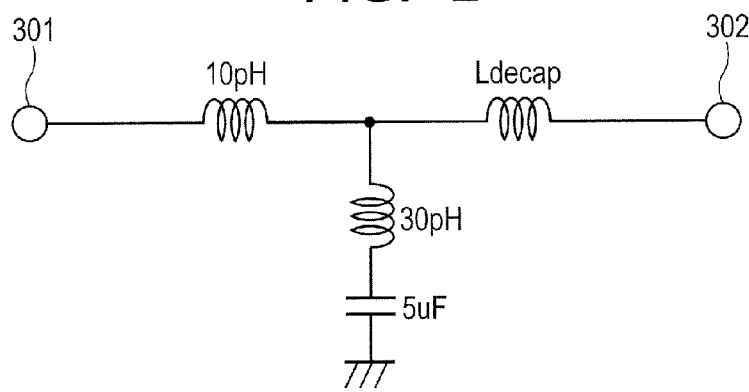
FIG. 2 is a circuit diagram illustrating a circuit configuration of the printed circuit board according to the first embodiment of the present invention.

Next, the inductance values and the electric resistance values required for the power wiring and the ground wiring of the printed circuit board according to the first embodiment of the present invention are described based on simulation results. FIG. 2 is a diagram illustrating a circuit configuration for examining the inductance values required for the power wiring and the ground wiring of the printed circuit board. A node 301 and a node 302 respectively correspond to the LSI 102 and the LSI 103 illustrated in FIGS. 1A to 1D. In the case of assuming an LSI having a flip-chip package structure, a package portion of the LSI 102 has an inductance value of 10 pH. The capacitor 105 has a capacitance value of 5 μF and an inductance value of 30 pH. An equivalent inductance value of a power wiring path that connects the LSI 102 and the LSI 103 is represented by "Ldecap".

When the frequency is 1 GHz and the specific dielectric constant of the dielectric material is 4.5, a high-inductance wiring region can be calculated to be 17.7 mm based on Expression 1.

The printed wiring board 101 is a four-layer printed wiring board having a cross-sectional structure shown in Table 1 below, in which the power pattern 131 having a width of 15 mm and the solid ground pattern 121 are formed in the second layer and the third layer, respectively. The inductance value of the power pattern 131 and the ground pattern 121 in a region 16 mm away from the edge of the LSI 102 is calculated to be 2.2 nH by using PowerSI manufactured by Sigrity, Inc.

TABLE 1

| Layer configuration | Thickness [μm] | Conductivity [S/m] | Specific dielectric constant | Dielectric loss |
| --- | --- | --- | --- | --- |
| Resist | 20 | | 4.5 | 0.035 |
| First layer | 18 | 5.80E+07 | | |
| Prepreg | 100 | | 4.5 | 0.035 |
| Second layer | 35 | 5.80E+07 | | |
| Core | 1,200 | | 4.5 | 0.035 |
| Third layer | 35 | 5.80E+07 | | |
| Prepreg | 100 | | 4.5 | 0.035 |
| Fourth layer | 18 | 5.80E+07 | | |
| Resist | 20 | | 4.5 | 0.035 |

Figure 3:
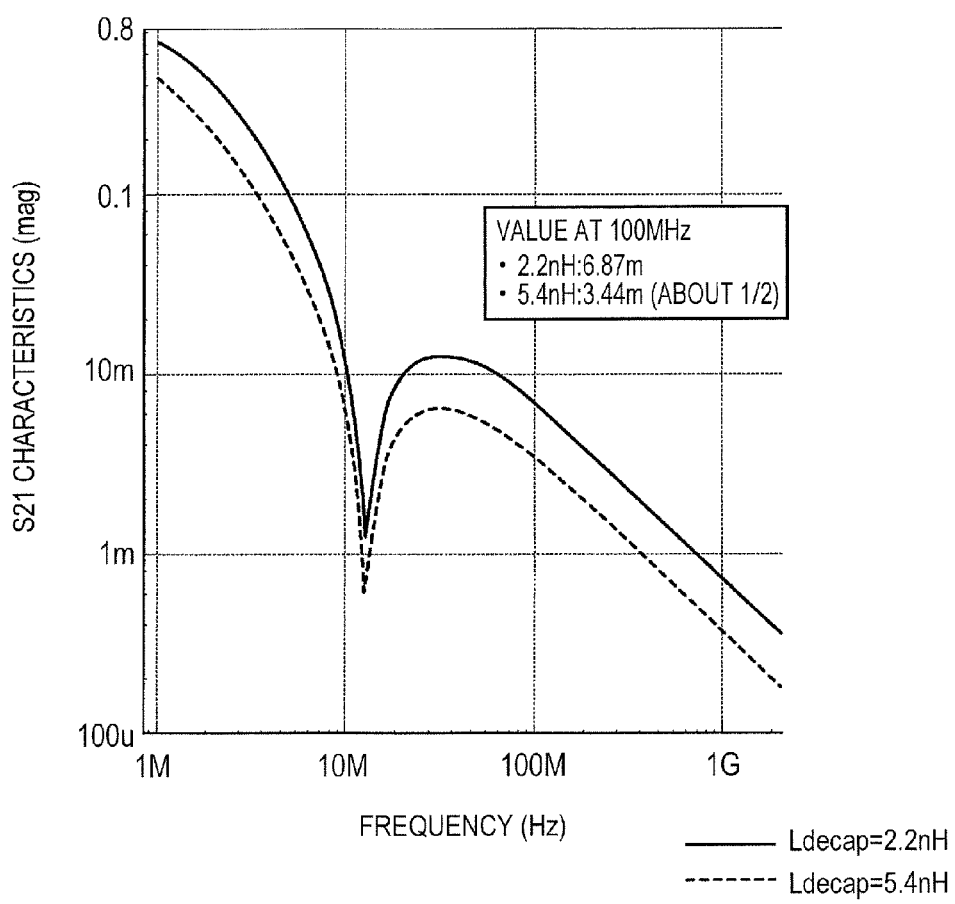
FIG. 3 is a graph showing transmission characteristics of the circuit illustrated in FIG. 2.

FIG. 3 shows the results of analyzing transmission characteristics from the node 301 to the node 302 when the circuit simulation of FIG. 2 was conducted by using HSPICE manufactured by Synopsys Inc. The inductance value in the typical power wiring structure is 2.2 nH as described above. A reference is transmission characteristics with Ldecap of 2.2 nH. In this case, in order to suppress the transmission amount of power noise from the node 301 to the node 302 to be ½ or less in the band of 100 MHz in which the control by the capacitor 105 is difficult, it is necessary to set Ldecap to 5.4 nH. As long as the propagation amount of power noise is suppressed to be ½ or less, the risk of a malfunction is significantly reduced.

Now, an inductance value of a partial region of the power pattern 131 that is apart from a part corresponding to an end surface of the contour of the LSI 102 within the distance calculated by Expression 1 as viewed from the direction perpendicular to the surface of the printed wiring board 101 is represented by "La". An inductance value of a partial region of the ground pattern 121 that overlaps the partial region of the power pattern 131 as viewed from the direction perpendicular to the surface of the printed wiring board 101 is represented by "Lb". In this case, it is desired that the defect portion 122 be formed in the partial region of the ground pattern 121 so that the sum of the inductance value La and the inductance value Lb may be 5.4 nH or more.

It is preferred to form the power pattern 131 so that the power voltage drop in the power pattern 131 may be suppressed to be 5% or less. As a specific example, in the case where the LSI 102 needs to supply 10 A to a 1 V power supply, it is desired to form the power pattern 131 so that the electric resistance value of the power pattern 131 of the printed wiring board 101 may be 5 mΩ or less in order to suppress the power voltage drop to be 5% or less.

In the printed circuit board 100 illustrated in FIG. 1D, the line segment L connects a gravity point G1 of the contour of the LSI 102 and a gravity point G2 of the contour of the LSI 104 as a power supply member. As illustrated in FIG. 1D, the defect portion 122 is formed at a position that does not intersect with the line segment L as viewed from the direction perpendicular to the surface of the printed wiring board 101.

The return current having a DC power potential from the LSI 102 flows straight in the ground pattern 121 along a path indicated by the line segment L, and the defect portion 122 does not hinder the return current from taking the shortest way. Therefore, the rise in electric resistance value of the ground pattern 121 with respect to a DC current can be suppressed more effectively.

In the first embodiment described above, the defect portion 122 is a single rectangular ground defect, and the single region 121a is formed to extend linearly. However, the present invention is not limited thereto. FIGS. 4A to 4F are explanatory diagrams illustrating modified examples of the defect portion formed in the third region R3 of the ground pattern 121.

Figure 4A:
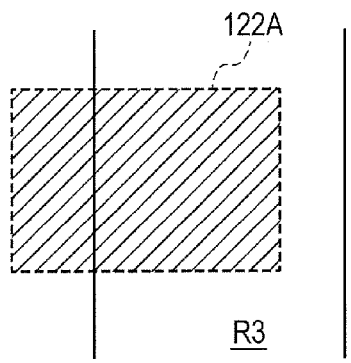
FIG. 4A is a conceptual diagram illustrating a modified example of a defect portion of the printed circuit board according to the first embodiment of the present invention.
Figure 4B:
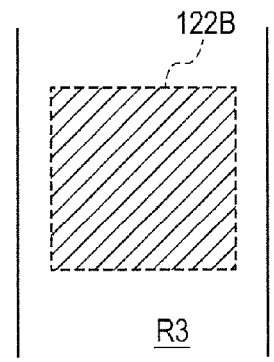
FIG. 4B is a conceptual diagram illustrating another modified example of the defect portion of the printed circuit board according to the first embodiment of the present invention.

FIGS. 4A and 4B are diagrams illustrating the cases where the defect portion is formed of a single ground defect. As illustrated in FIG. 4A, a defect portion 122A may be formed to extend off the third region R3 to a region other than the ground region. Alternatively, as illustrated in FIG. 4B, a defect portion 122B may be formed inside the third region R3 so as not to be in contact with the boundary of the third region R3.

Figure 4C:
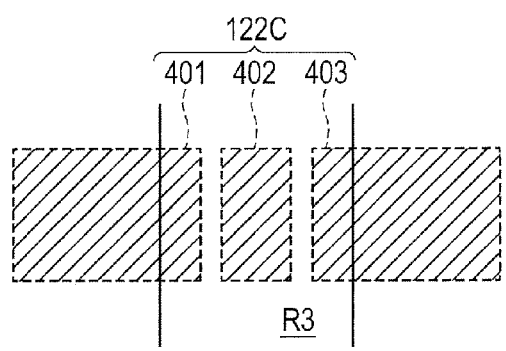
FIG. 4C is a conceptual diagram illustrating another modified example of the defect portion of the printed circuit board according to the first embodiment of the present invention.
Figure 4D:
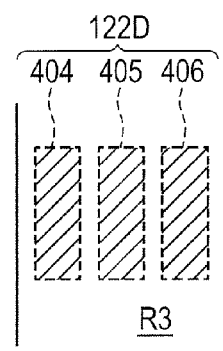
FIG. 4D is a conceptual diagram illustrating another modified example of the defect portion of the printed circuit board according to the first embodiment of the present invention.

FIGS. 4C and 4D are diagrams illustrating the cases where the defect portion is formed of multiple ground defects, and the multiple ground defects are arranged side by side in the direction orthogonal to the extending direction of the power pattern.

As illustrated in FIG. 4C, a defect portion 122C may be formed of multiple (three in this case) ground defects 401, 402, and 403. In FIG. 4C, the ground defects 401 and 403 are formed to extend off the third region R3, and the ground defect 402 is formed inside the third region R3. If the ground defects 401 and 403 are formed not to extend off the third region, the rise in electric resistance value of the ground pattern can be suppressed more effectively.

As illustrated in FIG. 4D, a defect portion 122D may be formed of multiple (three in this case) ground defects 404, 405, and 406, and all the ground defects 404, 405, and 406 may be formed inside the third region R3 so as not to be in contact with the boundary of the third region R3.

There is no particular limitation to the arrangement direction of the multiple ground defects. The ground defects may be arranged side by side as illustrated in FIGS. 4C and 4D, or may be arranged irregularly. The number of the ground defects formed only needs to be at least two.

The ground defects illustrated in FIGS. 4C and 4D only need to be formed at intervals so as not to be in contact with each other. This avoids the third region R3 from being divided into multiple regions. In other words, even when the third region R3 that has multiple ground defects formed therein is projected onto the power pattern 131, the LSI 102 and the LSI 104 are not separated from each other.

Figure 4E:
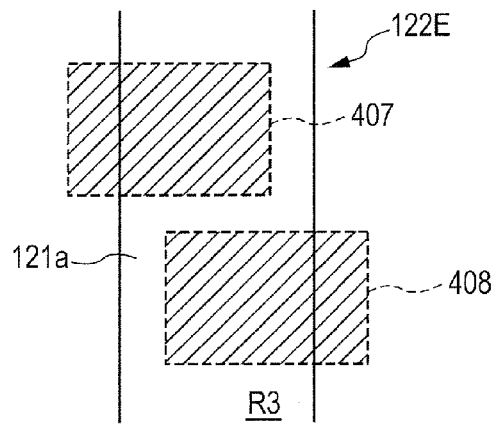
FIG. 4E is a conceptual diagram illustrating another modified example of the defect portion of the printed circuit board according to the first embodiment of the present invention.
Figure 4F:
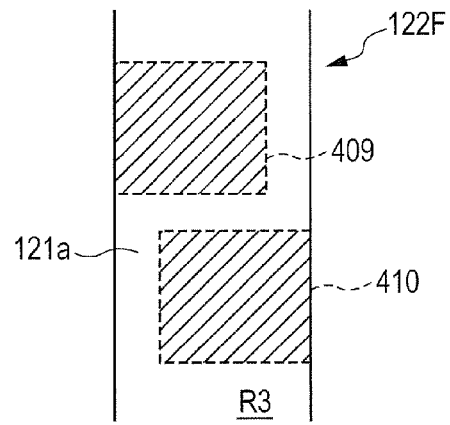
FIG. 4F is a conceptual diagram illustrating another modified example of the defect portion of the printed circuit board according to the first embodiment of the present invention.

FIGS. 4E and 4F are diagrams illustrating the cases where the defect portion is formed of multiple ground defects, and the multiple ground defects are arranged side by side in the direction parallel to the extending direction of the power pattern.

As illustrated in FIG. 4E, a defect portion 122E is formed of two ground defects 407 and 408, and the ground defect 407 is formed to straddle one boundary of the third region R3 while the ground defect 408 is formed to straddle the other boundary of the third region R3. In this way, the ground defects 407 and 408 are provided in a zigzag manner, and hence the region 121a in the third region R3 can be formed into a crank shape. This structure can ensure the length of the region 121a, thus enhancing the effect of increasing the inductance of the power pattern 131 and the ground pattern 121 as compared to the first embodiment.

As illustrated in FIG. 4F, it is more preferred that a defect 122F be formed of two ground defects 409 and 410, and the ground defects 409 and 410 be formed in contact with the boundaries of the third region R3 in a zigzag manner so as not to extend off the boundaries of the third region R3. Also this structure can enhance the effect of increasing the inductance of the power pattern 131 and the ground pattern 121. The ground defects 409 and 410 are formed only inside the third region R3, and hence, as compared to the structure illustrated in FIG. 4E, the area of the ground defects can be reduced, and hence the increase in electric resistance value of the ground pattern 121 can be suppressed.

As described above, the use of multiple ground defects can obtain the effect of increasing the inductance while keeping the power and the ground to be low in resistance, and enables ground wiring design in accordance with the position of the ground terminal of the LSI.

Second Embodiment

Figure 5:
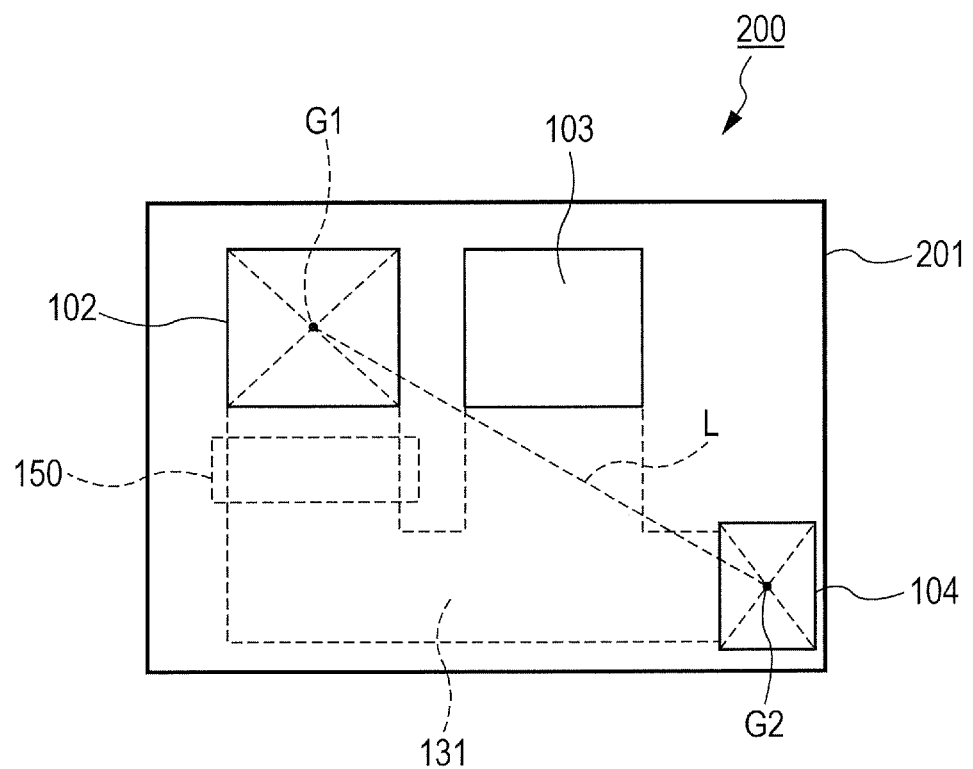
FIG. 5 is a schematic diagram illustrating a configuration of a printed circuit board according to a second embodiment of the present invention.

Next, a printed circuit board according to a second embodiment of the present invention is described. FIG. 5 is an explanatory diagram illustrating a schematic configuration of the printed circuit board according to the second embodiment of the present invention. A printed circuit board 200 in the second embodiment is different from that in the first embodiment in the configuration of a defect in a region 150 illustrated by a broken line in FIG. 5. The other configurations are the same as in the first embodiment.

Figure 6A:
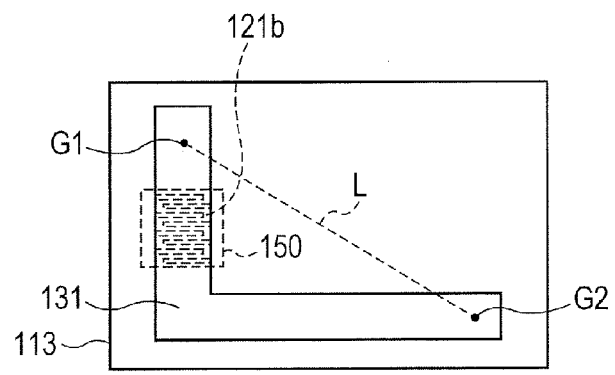
FIG. 6A is a schematic diagram illustrating details of the printed circuit board according to the second embodiment of the present invention.
Figure 6B:
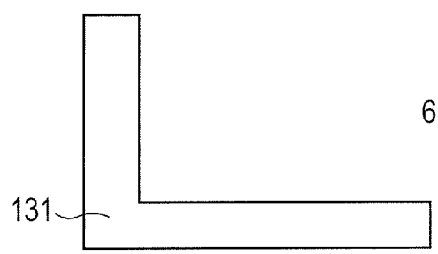
FIG. 6B is a schematic diagram illustrating details of the printed circuit board according to the second embodiment of the present invention.
Figure 6C:
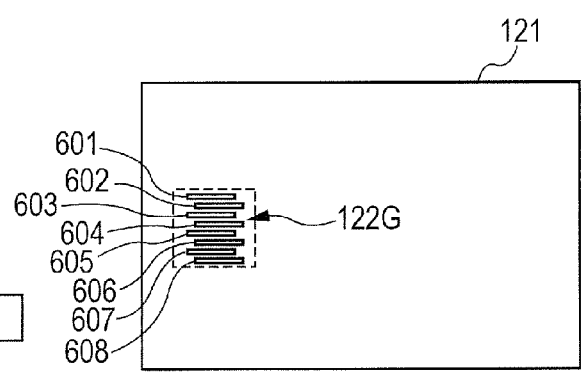
FIG. 6C is a schematic diagram illustrating details of the printed circuit board according to the second embodiment of the present invention.

FIGS. 6A to 6C are explanatory diagrams illustrating a main portion of the printed circuit board 200 according to the second embodiment of the present invention. FIG. 6A is a plan view of a power layer of a printed wiring board 201. FIG. 6B is a plan view of a power pattern in the power layer. FIG. 6C is a plan view of a ground layer of the printed wiring board 201. In the second embodiment, a defect portion 122G is formed so that a region 121b of the ground pattern 121 has a meander shape.

Specifically, the defect portion 122G includes multiple (eight in FIGS. 6A to 6C) ground defects 601 to 608, and the multiple ground defects 601 to 608 are arranged side by side in the ground pattern 121 at intervals along the extending direction of the power pattern 131. The multiple ground defects 601 to 608 are formed in a zigzag manner in the direction orthogonal to the extending direction of the power pattern 131. In other words, the region 121b has at least two crank portions and at least three ground defects in order to prevent the straight propagation of return current of noise.

It is preferred in the meander region 121b that a width extending in the direction parallel to the power pattern 131 and a width extending in the direction orthogonal to the power pattern 131 be substantially the same.

FIGS. 7A and 7B are partially enlarged diagrams of the defect portion 122G. FIG. 7A illustrates an example of the defect portion 122G, and FIG. 7B illustrates another example of the defect portion. In FIGS. 7A and 7B, three ground defects 601, 602, and 603 among the ground defects of the defect portion 122G are illustrated.

In FIG. 7A, the ground defects 601 and 603 are formed to straddle one boundary of the third region R3 while the ground defect 602 is formed to straddle the other boundary of the third region R3. In this way, the ground defects 601, 602, and 603 are provided in a zigzag manner, and hence the region 121b in the third region R3 can be formed into a meander structure. This structure can ensure the length of the region 121b, thus enhancing the effect of increasing the inductance of the power pattern 131 and the ground pattern 121 as compared to the first embodiment.

As illustrated in FIG. 7B, it is more preferred that the ground defects 601, 602, and 603 be formed in contact with the boundaries of the third region R3 in a zigzag manner so as not to extend off the boundaries of the third region R3. Also this structure can enhance the effect of increasing the inductance of the power pattern 131 and the ground pattern 121. The ground defects 601, 602, and 603 are formed only inside the third region R3, and hence, as compared to the structure illustrated in FIG. 7A, the area of the ground defects can be reduced, and hence the increase in electric resistance value of the ground pattern 121 can be suppressed.

Although the defect portion 122G in the second embodiment is formed of multiple (at least three) strip-shaped (rectangular) ground defects, the defect portion is not limited to this shape. For example, the defect portion may be formed of two comb ground defects having alternate comb parts.

Example 2

Next, a simulation was conducted on the configuration of the printed circuit board 200 according to the second embodiment of the present invention. The printed wiring board 201 had the properties shown in Table 1 similarly to the first embodiment. As shown in Table 2 below, the ground pattern had the structure in which eight ground defects having a width of 1 mm were provided alternately at intervals of 1 mm.

TABLE 2

| Analysis conditions | |
| --- | --- |
| Circuit board | Four-layer substrate (2nd layer: GND, 3rd layer: Power) |

TABLE 2-continued

Analysis conditions

| | |
|---|---|
| Power wiring width | 15 mm |
| Power wiring length | 100 mm |
| Ground | Solid pattern, except for defects |
| Defect width | 1 mm |
| Number of defects | 8 in total (in an alternate manner) |
| Defect interval | 1 mm at equal intervals |

The parameters of the layer configuration shown in Table 1 were used to calculate the respective characteristics by means of PowerDC and PowerSI manufactured by Sigrity, Inc. A power-ground loop that connects a gravity point G1 of the LSI 102 and a gravity point G2 of the LSI 104 serving as the power supply member had an electric resistance value of 4.7 mΩ and an inductance value of 70.6 nH. Those values were calculated as electric characteristics of wiring at points within 16 mm from the external edge of the LSI 102. Both the electric resistance value and the inductance value satisfy the electric characteristics shown in the first embodiment.

Figure 8:
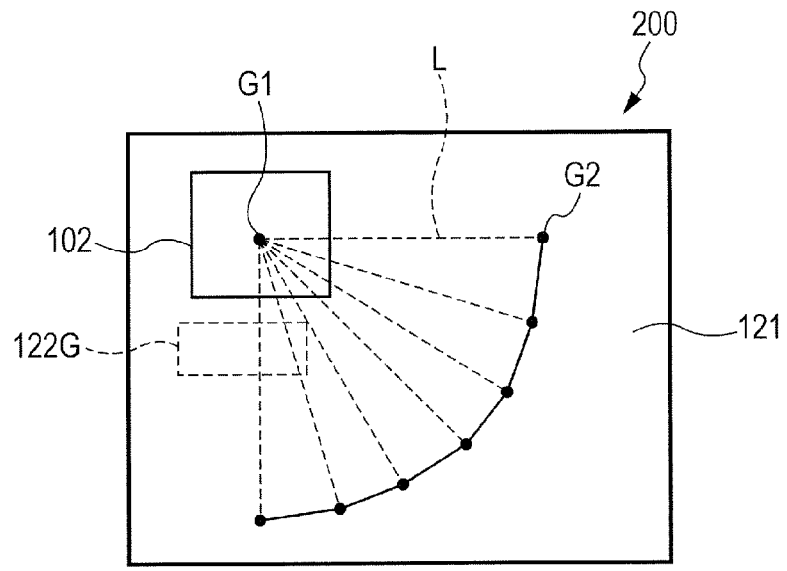
FIG. 8 is a conceptual diagram for examining electrical characteristics of the printed circuit board according to the second embodiment of the present invention.
Figure 9:
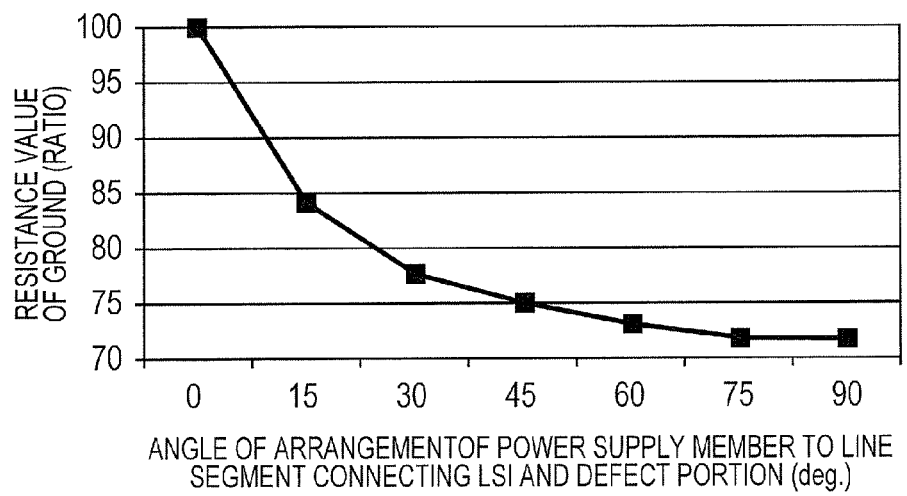
FIG. 9 is a graph showing a change in electrical resistance value of the ground of the printed circuit board according to the second embodiment of the present invention.

Now, how the electric characteristics are affected depending on the gravity point G1 of the LSI 102, the gravity point G2 of the LSI 104, and the position of the defect portion 122G of the ground pattern 121 is described with reference to FIGS. 8 and 9. As illustrated in FIG. 8, the electric characteristics were calculated in a manner that the gravity point G2 of the LSI 104 serving as the power supply member was moved about the gravity point G1 by 90 degrees in 15 degree increments in a concentric circle with a radius of a line segment L. FIG. 9 and Table 3 show the electric resistance value of the ground calculated by the above-mentioned PowerDC. In FIG. 8, the angle at which the gravity point G2 is located downward of the printed circuit board 200 in FIG. 8 after passing above the defect portion 122G from the gravity point G1 is defined as 0 degrees. The line segment L passes the defect portion 122G until the gravity point G2 is located at 30 degrees. It is confirmed that the electric resistance value of the ground considerably increases in a region in which the defect portion 122G and the line segment L intersect with each other.

Note that, the same holds true for the case where the gravity point G1 and the gravity point G2 are replaced with the positions corresponding to both edges of the power pattern 131.

TABLE 3

| Angle (deg.) | Ratio of resistance value of ground pattern |
|---|---|
| 0 | 100 |
| 15 | 84.2 |
| 30 | 77.7 |
| 45 | 75.2 |
| 60 | 73.2 |
| 75 | 71.9 |
| 90 | 71.8 |

Next, the inductance value and the electric resistance value were compared between the printed circuit board 200 according to the second embodiment illustrated in FIG. 5 and printed circuit boards according to Comparative Examples 1 and 2 of the present invention.

Comparative Example 1

Figure 10A:
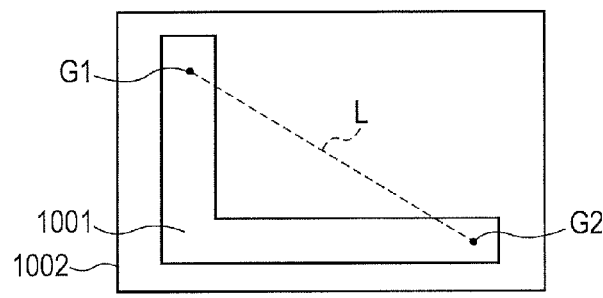
FIG. 10A is a schematic diagram illustrating a schematic configuration of a printed circuit board according to Comparative Example 1 of the present invention.
Figure 10B:
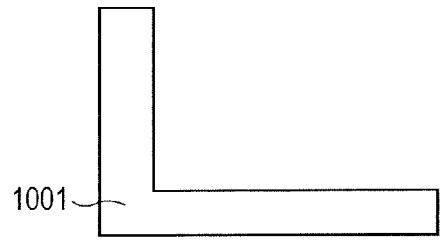
FIG. 10B is a schematic diagram illustrating a schematic configuration of the printed circuit board according to Comparative Example 1 of the present invention.
Figure 10C:
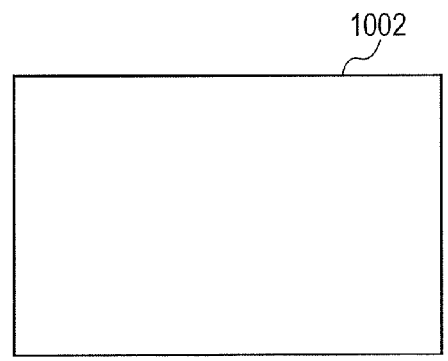
FIG. 10C is a schematic diagram illustrating a schematic configuration of the printed circuit board according to Comparative Example 1 of the present invention.

FIGS. 10A to 10C are explanatory diagrams illustrating a schematic configuration of the printed circuit board according to Comparative Example 1, illustrating the configuration of the printed circuit board in which no defect portions are formed in the power pattern and the ground pattern. FIG. 10A superimposes a power pattern 1001, a ground pattern 1002, a gravity point G1 of the contour of the LSI 102, and a gravity point G2 of the LSI 104 as the power supply member. FIG. 10B illustrates the power pattern 1001 and FIG. 10C illustrates the ground pattern 1002. The power pattern 1001 and the ground pattern 1002 are respectively wired in the third layer and the second layer of the printed circuit board shown in Table 1.

Comparative Example 2

Figure 11A:
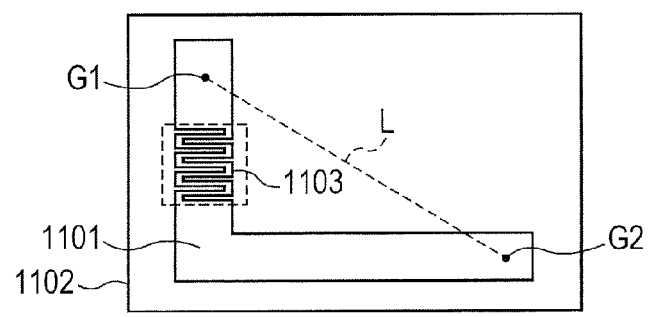
FIG. 11A is a schematic diagram illustrating a schematic configuration of a printed circuit board according to Comparative Example 2 of the present invention.
Figure 11B:
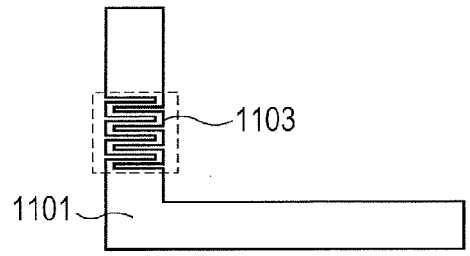
FIG. 11B is a schematic diagram illustrating a schematic configuration of the printed circuit board according to Comparative Example 2 of the present invention.
Figure 11C:
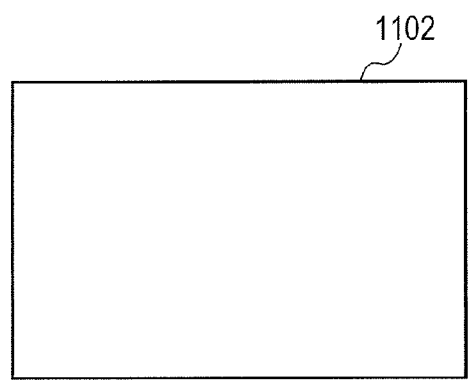
FIG. 11C is a schematic diagram illustrating a schematic configuration of the printed circuit board according to Comparative Example 2 of the present invention.

FIGS. 11A to 11C are explanatory diagrams illustrating a schematic configuration of the printed circuit board according to Comparative Example 2, illustrating the configuration of the conventional printed circuit board in which the power pattern has a meander structure. A meander portion 1103 of a power pattern 1101 is illustrated in FIGS. 11A and 11B. FIG. 11A superimposes the power pattern 1101, a ground pattern 1102, a gravity point G1 of the contour of the LSI 102, and a gravity point G2 of the LSI 104 as the power supply member. FIG. 11B illustrates the power pattern 1101 and FIG. 11C illustrates the ground pattern 1102. The power pattern 1101 and the ground pattern 1102 are respectively wired in the third layer and the second layer of the printed circuit board shown in Table 1. As shown in Table 2, the meander structure of the power pattern is formed so that eight power patterns having a width of 1 mm are provided alternately at intervals of 1 mm.

Note that, as the common structures of the power and the ground illustrated in each of FIGS. 7A and 7B, FIGS. 10A to 10C, and FIGS. 11A to 11C, the wiring width of the power pattern was set to 15 mm, the Manhattan length of the line segment L connecting the gravity point G1 of the LSI 102 and the gravity point G2 of the LSI 104 as the power supply member was set to 100 mm, and the ground pattern was a solid pattern.

Figure 12:
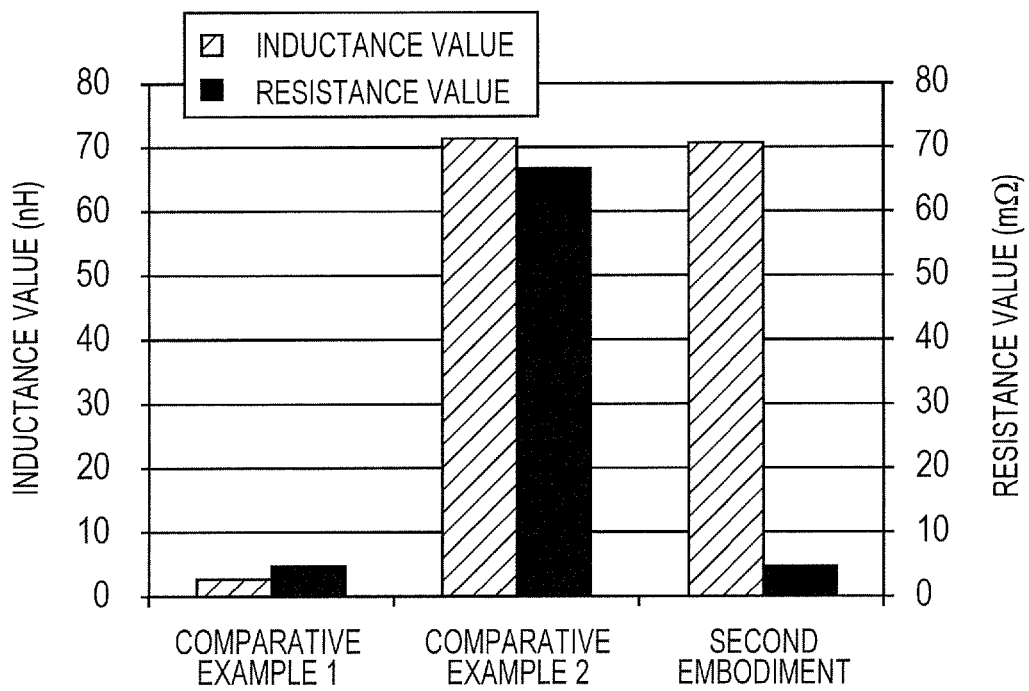
FIG. 12 is a graph showing the electrical characteristics of the printed circuit board according to the second embodiment of the present invention.

FIG. 12 and Table 4 show the results of analyzing the electric resistance value and the inductance value by using the above-mentioned simulation tool. In the simulation, the electric resistance value and the inductance value in the power-ground loop connecting the gravity point G1 of the LSI 102 and the gravity point G2 of the LSI 104 were calculated.

TABLE 4

| | Inductance value | Resistance value |
|---|---|---|
| Comparative Example 1 | 2.2 nH | 4.6 mΩ |
| Comparative Example 2 | 70.2 nH | 66.9 mΩ |
| Second Embodiment | 70.6 nH | 4.7 mΩ |

In the structure of Example 2, the electric resistance value is comparable to that in the structure of Comparative Example 1 having no defect in the power pattern and the ground pattern, and the inductance value is comparable to that in the structure of Comparative Example 2 using the meander structure of the power wiring.

The present invention is not limited to the above-mentioned embodiments, and various modifications are possible within the technical idea of the present invention by a person having ordinary skill in the art.

In Example 1 and Example 2 described above, the printed wiring board includes the signal wiring layer, the ground layer, the power layer, and the signal wiring layer in this order, and the dielectric layers are provided between the respective layers, but the present invention is not limited thereto. The order of the ground layer and the power layer may be replaced or the numbers of the ground layers and the power layers may be multiple as long as the ground layer and the power layer are adjacent to each other across the dielectric layer.

In Example 1 and Example 2 described above, the printed wiring board has a four-layer structure. However, the printed wiring board only needs to have at least two layers having the power layer and the ground layer.

In the first and second embodiments described above, the power supply member is an LSI (semiconductor device), but the present invention is not limited thereto. The power supply member may be formed of multiple semiconductor devices, or may be combined with an inductor, capacitor, a resistor, or the like in addition to a semiconductor device. Alternatively, the power supply member may be a connector to be connected to an external power supply.

In the first and second embodiments described above, the LSIs 102, 103, and 104 are mounted on one surface of the printed wiring board, but the present invention is not limited thereto. Part or all of the LSIs 102, 103, and 104 may be mounted on the other surface of the printed wiring board.

In the first and second embodiments described above, the power pattern that connects the LSI 102 as a semiconductor device and the LSI 104 as a power supply member is connected to the LSI 103 as another semiconductor device, but the present invention is not limited thereto. Multiple semiconductor devices in addition to the LSI 102 may be connected to the power pattern. Alternatively, no other semiconductor devices than the LSI 102 may be connected to the power pattern. In the case where multiple semiconductor devices are connected, it is preferred that the semiconductor devices be each connected to a decoupling capacitor similarly to the first and second embodiments. Instead of being provided on the other surface layer of the printed wiring board, the decoupling capacitor may be provided on one surface layer of the printed wiring board on which the semiconductor device is mounted, or in an inner layer of the printed wiring board.

In the first and second embodiments described above, the defect portion is formed correspondingly to the LSI 102. Alternatively, however, the defect portion may be formed correspondingly to the other LSI 103 or correspondingly to both the LSIs 102 and 103. Also in the case where multiple semiconductor devices are connected to the power pattern, the defect portion only needs to be formed correspondingly to at least one semiconductor device similarly.

In the first and second embodiments described above, the capacitor 105 (106) is a single capacitor element. Alternatively, however, the capacitor 105 (106) may be formed of multiple capacitor elements.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-088554, filed Apr. 9, 2012, which is hereby incorporated by reference herein in its entirety.

What is claimed is:

1. A printed circuit board, comprising:
   a printed wiring board including:
      a power layer having a wiring-shaped power pattern formed therein; and
      a ground layer having a plane-shaped ground pattern formed therein, the ground layer being opposed to the power layer across a dielectric layer;
   a semiconductor device mounted on the printed wiring board, the semiconductor device having a power terminal connected to the power pattern and a ground terminal connected to the ground pattern; and
   a power supply member mounted on the printed wiring board, the power supply member supplying DC power to the semiconductor device via the power pattern and the ground pattern, so that the wiring-shaped power pattern is a wiring connecting the power supply member to the semiconductor device,
   wherein the ground pattern has a overlapping region overlapping the wiring-shaped power pattern as viewed from a direction perpendicular to a surface of the printed wiring board,
   wherein at least one defect portion is formed on the ground pattern, the defect portion overlapping the wiring-shaped power pattern as viewed from a direction perpendicular to a surface of the printed wiring board, so that the overlapping region is defined as a wiring-shaped ground pattern region, the wiring-shaped ground pattern region connecting the power supply member and the semiconductor device,
   wherein a wiring-width of a part of the wiring-shaped ground pattern region beside the defect portion, which is perpendicular to a wiring direction of the wiring-shaped power pattern, is narrower than a wiring-width of the wiring-shaped power pattern, and
   wherein the defect portion does not cross a power pass transmitting a power from a power supply member to the semiconductor device on the wiring-shaped power pattern as viewed from a direction perpendicular to a surface of the printed wiring board.

2. The printed circuit board according to claim 1, wherein the at least one defect portion is formed at a position that does not intersect with a line segment connecting the semiconductor device and the power supply member, as viewed from the direction perpendicular to the surface of the printed wiring board.

3. A printed wiring board, comprising:
   a power layer having a wiring-shaped power pattern formed therein; and
   a ground layer having a plane-shaped ground pattern formed therein, the ground layer being opposed to the power layer across a dielectric layer,
   wherein the ground pattern has a overlapping region overlapping the wiring-shaped power pattern as viewed from a direction perpendicular to a surface of the printed wiring board,
   wherein at least one defect portion is formed on the ground pattern, the defect portion overlapping the wiring-shaped power pattern as viewed from a direction perpendicular to a surface of the printed wiring board, so that the overlapping region is defined as a wiring-shaped ground pattern region,
   wherein a wiring-width of a part of the wiring-shaped ground pattern region beside the defect portion, which is perpendicular to a wiring direction of the wiring-shaped power pattern, is narrower than a wiring-width of the wiring-shaped power pattern, and
   wherein the defect portion does not cross a power pass transmitting a power along the wiring-shaped power pattern as viewed from a direction perpendicular to a surface of the printed wiring board.

4. The printed wiring board according to claim 3, wherein the at least one defect portion is formed at a position that does not intersect with a line segment connecting both edges of the power pattern, as viewed from the direction perpendicular to the surface of the printed wiring board.

5. The printed circuit board according to claim 1, wherein an inductance value of the wiring-shaped power pattern is two and a half times or more, compared with the case where the defect portion is not present.

6. The printed circuit board according to claim 1, wherein a plurality of defect portions are formed on the ground pattern so as to be spaced apart from each other, and the ground pattern exists between each of the defect portions.

7. The printed wiring board according to claim 3, wherein an inductance value of the wiring-shaped power pattern is two and a half times or more, compared with the case where the defect portion is not present.

8. The printed wiring board according to claim 3, wherein a plurality of defect portions are formed on the ground pattern so as to be spaced apart from each other, and the ground pattern exists between each of the defect portions.

9. The printed circuit board according to claim 6, wherein a plurality of defect portions is formed along the wiring direction of the wiring-shaped power pattern so that a part or the wiring-shaped ground pattern region forms a meander as viewed from a direction perpendicular to a surface of the printed wiring board.

10. The printed wiring board according to claim 7, wherein a plurality of defect portions is formed along the wiring direction of the wiring-shaped power pattern so that a part or the wiring-shaped ground pattern region forms a meander as viewed from a direction perpendicular to a surface of the printed wiring board.

11. The printed circuit board according to claim 1, wherein transmission amount of power noise propagated from the semiconductor device to the power supply member is ½ or less, compared with the case where the defect portion is not present.

\* \* \* \* \*